US011747437B2

(12) United States Patent
Seler et al.

(10) Patent No.: US 11,747,437 B2
(45) Date of Patent: Sep. 5, 2023

(54) DEVICE AND METHOD FOR TRANSMITTING A RADAR SIGNAL

(71) Applicant: Infineon Technologies AG, Neubiberg (DE)

(72) Inventors: Ernst Seler, Munich (DE); Ulrich Moeller, Holzkirchen (DE); Markus Treml, Altmuenster (AT)

(73) Assignee: Infineon Technologies AG, Neubiberg (DE)

( * ) Notice: Subject to any disclaimer, the term of this patent is extended or adjusted under 35 U.S.C. 154(b) by 126 days.

(21) Appl. No.: 16/947,605

(22) Filed: Aug. 10, 2020

(65) Prior Publication Data

US 2021/0055376 A1    Feb. 25, 2021

(30) Foreign Application Priority Data

Aug. 19, 2019    (DE) .......................... 102019122156.0

(51) Int. Cl.
*G01S 7/35*    (2006.01)
*G01S 13/34*    (2006.01)
(Continued)

(52) U.S. Cl.
CPC ............... *G01S 7/35* (2013.01); *G01S 13/34* (2013.01); *H03F 1/00* (2013.01); *G01S 7/03* (2013.01);
(Continued)

(58) Field of Classification Search
CPC . G01S 7/35; G01S 13/34; G01S 7/032; G01S 2013/0254; G01S 13/931;
(Continued)

(56) References Cited

U.S. PATENT DOCUMENTS 6,587,072 B1 *   7/2003   Gresham ............... G01S 13/106
                                                342/25 R
8,941,534 B2 *   1/2015   Reuter ...................... G01S 7/03
                                                327/237
(Continued)

FOREIGN PATENT DOCUMENTS

DE   102013212079 A1   1/2015
DE   102016101318 A1   8/2016

OTHER PUBLICATIONS

Och et al., "A Scalable 77 GHz Massive MIMO FMCW Radar by Cascading Fully-Integrated Transceivers," Proceedings of the 2018 Asia-Pacific Microwave Conference (APMC), Nov. 6-9, 2018.
Zarr, "BiCMOS Versus CMOS," Entwicklung & Elektronik, Feb. 10, 2015 [retrieved on Aug. 27, 2020 from https.//www.industr.com/de/bicmos-versus-cmos-88414].

*Primary Examiner* — Timothy A Brainard
*Assistant Examiner* — Ismaaeel A. Siddiquee
(74) *Attorney, Agent, or Firm* — Harrity & Harrity, LLP

(57) ABSTRACT

The present disclosure relates to a radar transmitting device, comprising a CMOS transceiver chip configured to provide at least one local oscillator signal at an output of the CMOS transceiver chip, and at least one BiCMOS transmitter chip coupled to the CMOS transceiver chip. The BiCMOS transmitter chip has an input for the local oscillator signal, at least one amplifier coupled to the input, a plurality of outputs for outputting a radar transmission signal on the basis of the local oscillator signal, and a plurality of transmission paths between the input and the plurality of outputs. Each of the transmission paths has a controllable analog phase shifter for controllable beam scanning during emission of the radar transmission signal. Additionally or alternatively, individual transmission paths of the BiCMOS transmitter chip can be selectively activated or deactivated using control signals.

20 Claims, 5 Drawing Sheets

(51) Int. Cl.
*H03F 1/00* (2006.01)
*G01S 13/02* (2006.01)
*G01S 13/931* (2020.01)
*G01S 7/03* (2006.01)

(52) U.S. Cl.
CPC ............... *G01S 7/032* (2013.01); *G01S 7/034* (2013.01); *G01S 13/02* (2013.01); *G01S 13/931* (2013.01); *G01S 2013/0254* (2013.01); *H03F 2200/255* (2013.01)

(58) Field of Classification Search
CPC . G01S 7/034; G01S 7/03; G01S 13/02; H03F 1/00; H03F 2200/255
See application file for complete search history.

(56) References Cited

U.S. PATENT DOCUMENTS

| | | | |
|---|---|---|---|
| 9,807,570 B1* | 10/2017 | Lazarini | H04W 4/40 |
| 2006/0121869 A1* | 6/2006 | Natarajan | H01Q 3/22 |
| | | | 455/276.1 |
| 2007/0129040 A1 | 6/2007 | Adlerstein et al. | |
| 2007/0290930 A1* | 12/2007 | Krishnaswamy | H01Q 3/26 |
| | | | 331/25 |
| 2013/0113657 A1* | 5/2013 | Behbahani | H01Q 25/00 |
| | | | 342/373 |
| 2017/0062948 A1* | 3/2017 | Artemenko | H01Q 9/065 |
| 2019/0324136 A1* | 10/2019 | Amadjikpe | G01S 13/70 |

\* cited by examiner

DEVICE AND METHOD FOR TRANSMITTING A RADAR SIGNAL

CROSS REFERENCE TO RELATED APPLICATION

This application claims priority to German Patent Application No. 102019122156.0 filed on Aug. 19, 2019, the content of which is incorporated by reference herein in its entirety.

TECHNICAL FIELD

The present disclosure relates to devices and methods for transmitting radar signals, in particular devices and methods for beam scanning during emission of radar signals.

BACKGROUND

Vehicle radar chipset architectures generally use Bipolar Complementary Metal-Oxide Semiconductor (BiCMOS) chips. BiCMOS is a semiconductor technology which integrates two semiconductor technologies, those of the bipolar transistor and of the Complementary Metal-Oxide Semiconductor (CMOS) transistor or field effect transistor, in a single integrated circuit arrangement. Bipolar transistors offer high speed, high gain and low output resistance, which are excellent properties for radio-frequency analog amplifiers, for example, while CMOS technology offers a high input resistance and is outstandingly suitable for constructing simple low-power logic gates.

A number of CMOS transceiver chips (transceiver=transmitter-receiver) are currently in development. However, such transceivers (Rx and Tx within one chip) are generally disadvantageous with regard to scalability, e.g. the use of a plurality of chips for better sensor performance.

Transmission beam steering or transmission beam scanning is not currently implemented in automotive radar systems. Adaptation of a transmission radar beam to an environment of the vehicle or to a driving situation is limited with currently available radar sensors.

SUMMARY

Developing radar transmitting devices, for example with regard to transmission beam steering or transmission beam scanning, may be achieved using devices and methods described herein.

In accordance with a first aspect of the present disclosure, a radar transmitting device is proposed. The radar transmitting device comprises a CMOS transceiver chip configured to provide at least one local oscillator signal (LO signal) at an output of the CMOS transceiver chip. Furthermore, the radar transmitting device comprises at least one BiCMOS transmitter chip coupled to the CMOS transceiver chip. The BiCMOS transmitter chip comprises an input for the local oscillator signal, at least one amplifier coupled to the input, a plurality of outputs for outputting a radar transmission signal on the basis of the local oscillator signal, and a plurality of transmission paths between the input and the plurality of outputs. Each of the transmission paths of the BiCMOS transmitter chip has a controllable analog phase shifter for controllable beam scanning during emission of the radar transmission signal.

The proposed radar transmitting device makes possible, for example for use in motor vehicles, adaptive transmitting antenna characteristics (beam pattern) by virtue of the fact that it combines a CMOS transceiver chip with one or more BiCMOS transmitter chips. The BiCMOS transmitter chip enables transmission amplification and also settable transmission phases for the transmission paths and hence settable beam scanning (phased array).

The local oscillator signal provided by the CMOS transceiver chip can be understood to be for example an intermediate frequency signal or else an RF radar signal (RF=radio-frequency). The local oscillator signal can be unmodulated or modulated—depending on radar technology. By way of example, the local oscillator signal can be an FMCW signal (FMCW=Frequency-Modulated Continuous-Wave) which is generated in the CMOS transceiver chip and is then processed further in the at least one BiCMOS transmitter chip. FMCW radar signals are used in vehicle radar systems, in particular.

In accordance with some example implementations, the CMOS transceiver chip also has a phase control unit configured to generate phase control signals for controlling the analog phase shifters of the BiCMOS transmitter chip for beam scanning. Phase control signals for setting the phase shifters of the BiCMOS transmitter chip can thus be provided by a control logic of the CMOS transceiver chip. The CMOS transceiver chip can thus output as a controller for the beam scanning. For this purpose, it can optionally be coupled to a vehicle control unit (ECU), such that the beam scanning can be effected for example in a manner governed by driving situation and/or environment.

In accordance with some example implementations, the CMOS transceiver chip is also configured to selectively activate or deactivate individual transmission paths of the BiCMOS transmitter chip using control signals. Individual antennas of a transmitting antenna array that are coupled to the transmission paths can thus be switched off or on. The beam scanning can be effected more accurately and in a more targeted manner, the more transmission or antenna paths are switched on. If a low accuracy and/or a wide antenna characteristic are/is sufficient, for example, individual transmission or antenna paths can be switched off.

In accordance with some example implementations, the CMOS transceiver chip is also configured for digital beamforming for combination with the transmitter-end beam scanning. Digital beamforming can be used at the reception end, for example, in order to adapt an antenna characteristic of a receiving antenna array to the transmitter-end beam scanning. In accordance with some example implementations, the CMOS transceiver chip can thus have a plurality of reception channels, wherein phases of the reception channels are set during digital beamforming in such a way that an antenna characteristic or main reception direction is based on information of a set beam during the transmitter-end beam scanning.

In accordance with some example implementations, the CMOS transceiver chip is also configured for phase encoding of different radar transmission signals assigned to different transmission paths. Individual transmission or antenna paths can thus be assigned a specific phase in accordance with a MIMO code (MIMO=Multiple Input Multiple Output).

In accordance with some example implementations, the CMOS transceiver chip is configured to provide at its output at least one FMCW signal for the BiCMOS transmitter chip. That means that the CMOS transceiver chip carries out an FMCW modulation of the local oscillator signal. The BiCMOS transmitter chip then only amplifies the FMCW signal using one or more transmission amplifiers. If the CMOS transceiver chip does not yet provide the modulated local oscillator signal at the transmission frequency, but rather at a lower frequency for distribution among one or more BiCMOS transmitter chips, a frequency conversion to transmission frequency (e.g. 24 GHz (K-band), 76 GHz or 96 GHz (W-band)) can additionally also take place in the one or more BiCMOS transmitter chips.

In accordance with some example implementations, the CMOS transceiver chip can also be coupled to a plurality of BiCMOS transmitter chips. The radar transmitting device can thus comprise a first BiCMOS transmitter chip coupled to the CMOS transceiver chip and at least one second BiCMOS transmitter chip coupled to the CMOS transceiver chip. In this case, different BiCMOS transmitter chips can operate different transmitting antenna arrays or different sub-arrays of a transmitting antenna array, for example.

In accordance with some example implementations, the first BiCMOS transmitter chip is coupled to a first transmitting antenna array for beam scanning in an azimuth direction and the second BiCMOS transmitter chip is coupled to a second transmitting antenna array for beam scanning in an elevation direction. Consequently, emission directions both in an azimuth direction and in an elevation direction can be adapted to an environment of a vehicle and/or to a driving situation.

In accordance with some example implementations, the first BiCMOS transmitter chip is coupled to a first transmitting antenna array for beam scanning in an azimuth direction and the second BiCMOS transmitter chip is coupled to a second transmitting antenna array for beam scanning likewise in an azimuth direction. Consequently, emission directions in an azimuth direction can be adapted highly accurately to an environment and/or driving situation. Alternatively, the first BiCMOS transmitter chip can also be coupled to a first transmitting antenna array for beam scanning in an elevation direction and the second BiCMOS transmitter chip can be coupled to a second transmitting antenna array for beam scanning likewise in an an elevation direction. The first and second transmitting antenna arrays can also be sub-arrays of a transmitting antenna array. Consequently, emission directions in an elevation direction can be adapted highly accurately to an environment and/or driving situation.

In accordance with some example implementations, the CMOS transceiver chip has one or more reception inputs for one or more reception signals, the one or more inputs being able to be coupled to receiving antennas. In contrast to the transmission end, however, no BiCMOS chips are arranged between the reception inputs and receiving antennas. The reception signals can then be mixed with the local oscillator signal, for example, in the CMOS transceiver chip in order for example to obtain distance and speed information by way of a so-called range Doppler map.

As has already been mentioned in the introduction, bipolar transistors offer high speed, high gain and low output resistance, which are excellent properties for radio-frequency analog amplifiers, for example. Accordingly, in accordance with some example implementations, the at least one amplifier of the BiCMOS transmitter chip is embodied using bipolar technology. The phase shifters of the BiCMOS transmitter chip can likewise be embodied using bipolar technology.

In accordance with a further aspect of the present disclosure, a motor vehicle comprising a radar transmitting device according to any of the preceding aspects is proposed. This can further improve the safety of motor vehicles and contribute to extended autonomous driving properties for motor vehicles.

In accordance with yet another aspect of the present disclosure, a corresponding method for transmitting a radar signal is proposed. The method comprises providing a local oscillator signal mittels using a CMOS transceiver chip and further processing of the provided local oscillator signal using at least one BiCMOS transmitter chip. The further processing on the BiCMOS transmitter chip comprises amplifying the local oscillator signal or an RF radar signal derived therefrom, distributing the local oscillator signal or the RF radar signal derived therefrom among a plurality of transmission paths of the BiCMOS transmitter chip, wherein each of the transmission paths has a controllable analog phase shifter for controllable beam scanning during emission of the RF radar signal. The phase shifters of the BiCMOS transmitter chip are controlled using phase control signals. The phase control signals can be generated by the CMOS transceiver chip, for example.

In accordance with a further aspect of the present disclosure, a radar transmitting device is proposed. The radar transmitting device comprises a CMOS transceiver chip configured to provide at least one local oscillator signal at an output of the CMOS transceiver chip. The radar transmitting device furthermore comprises at least one BiCMOS transmitter chip coupled to the CMOS transceiver chip and having an input for the local oscillator signal, at least one amplifier coupled to the input, a plurality of outputs for outputting a radar transmission signal on the basis of the local oscillator signal, and a plurality of transmission paths between the input and the plurality of outputs. A transmitting antenna of a transmitting antenna array can be connected to each of the outputs. The CMOS controller chip is configured to selectively activate (switch on) or deactivate (switch off) individual transmission paths of the BiCMOS transmitter chip using control signals. Thus a number of active transmission or antenna paths can be set and, consequently, for example, a width of a directional characteristic of a transmitting antenna array can be varied.

In accordance with some example implementations, each of the transmission paths also has a controllable analog phase shifter for controllable beam scanning during emission of the RF radar transmission signal. It is thus possible to achieve beam scanning during emission of the RF radar transmission signal via an antenna array.

In accordance with some example implementations, the CMOS transceiver chip is also configured for phase encoding of different radar transmission signals assigned to different transmission paths. Individual transmission or antenna paths can thus be assigned a specific phase in accordance with a MIMO code.

In accordance with a further aspect of the present disclosure, a corresponding method for transmitting a radar signal is proposed. The method comprises providing a local oscillator signal using a CMOS transceiver chip and further processing of the local oscillator signal using at least one BiCMOS transmitter chip. The further processing on the BiCMOS transmitter chip comprises amplifying the local oscillator signal or a radar signal derived therefrom, distributing the local oscillator signal or the radar signal derived therefrom among a plurality of transmission paths of the BiCMOS transmitter chip, wherein each of the transmission paths is selectively activatable or deactivatable. Individual transmission paths are activated or deactivated using control signals. The control signals can be generated by the CMOS transceiver chip, for example.

The present disclosure thus proposes a use of a CMOS transceiver and at least one BiCMOS transmitter for the transmission-end realization of a phase-controlled antenna array for realizing an adaptive/cognitive radar sensor that can be used as a vehicle radar sensor, for example.

BRIEF DESCRIPTION OF THE FIGURES

Some examples of devices and/or methods are explained in greater detail merely by way of example below with reference to the accompanying figures, in which.

DESCRIPTION

Various examples will now be described more thoroughly with reference to the accompanying figures, in which some examples are illustrated. In the figures, the thicknesses of lines, layers and/or regions will be exaggerated for elucidation purposes.

While further examples are suitable for various modifications and alternative forms, some specific examples thereof are accordingly shown in the figures and described thoroughly below. However, this detailed description does not limit further examples to the specific forms described. Further examples can cover all modifications, counterparts and alternatives that fall within the scope of the disclosure. Throughout the description of the figures, identical or similar reference signs refer to identical or similar elements which can be implemented identically or in modified form in a comparison with one another, while they provide the same or a similar function.

It goes without saying that if one element is designated as "connected" or "coupled" to another element, the elements can be connected or coupled directly or via one or more intermediate elements. If two elements A and B are combined using an "or", this should be understood such that all possible combinations are disclosed, e.g. only A, only B, and A and B, unless explicitly or implicitly defined otherwise. An alternative wording for the same combinations is "at least one from A and B" or "A and/or B". The same applies, mutatis mutandis, to combinations of more than two elements.

The terminology used here for describing specific examples is not intended to be limiting for further examples. If a singular form, e.g. "a, an" and "the", is used and the use of only a single element is defined neither explicitly nor implicitly as obligatory, further examples can also use plural elements in order to implement the same function. If a function is described below as being implemented using a plurality of elements, further examples can implement the same function using a single element or a single processing entity. Furthermore, it goes without saying that the terms "comprises", "comprising", "has" and/or "having" in their usage specify the presence of the specified features, integers, steps, operations, processes, elements, components and/or a group thereof, but do not exclude the presence or the addition of one or more other features, integers, steps, operation, processes, elements, components and/or a group thereof.

Unless defined otherwise, all terms (including technical and scientific terms) are used here in their customary meaning in the field with which examples are associated.

Figure 1:
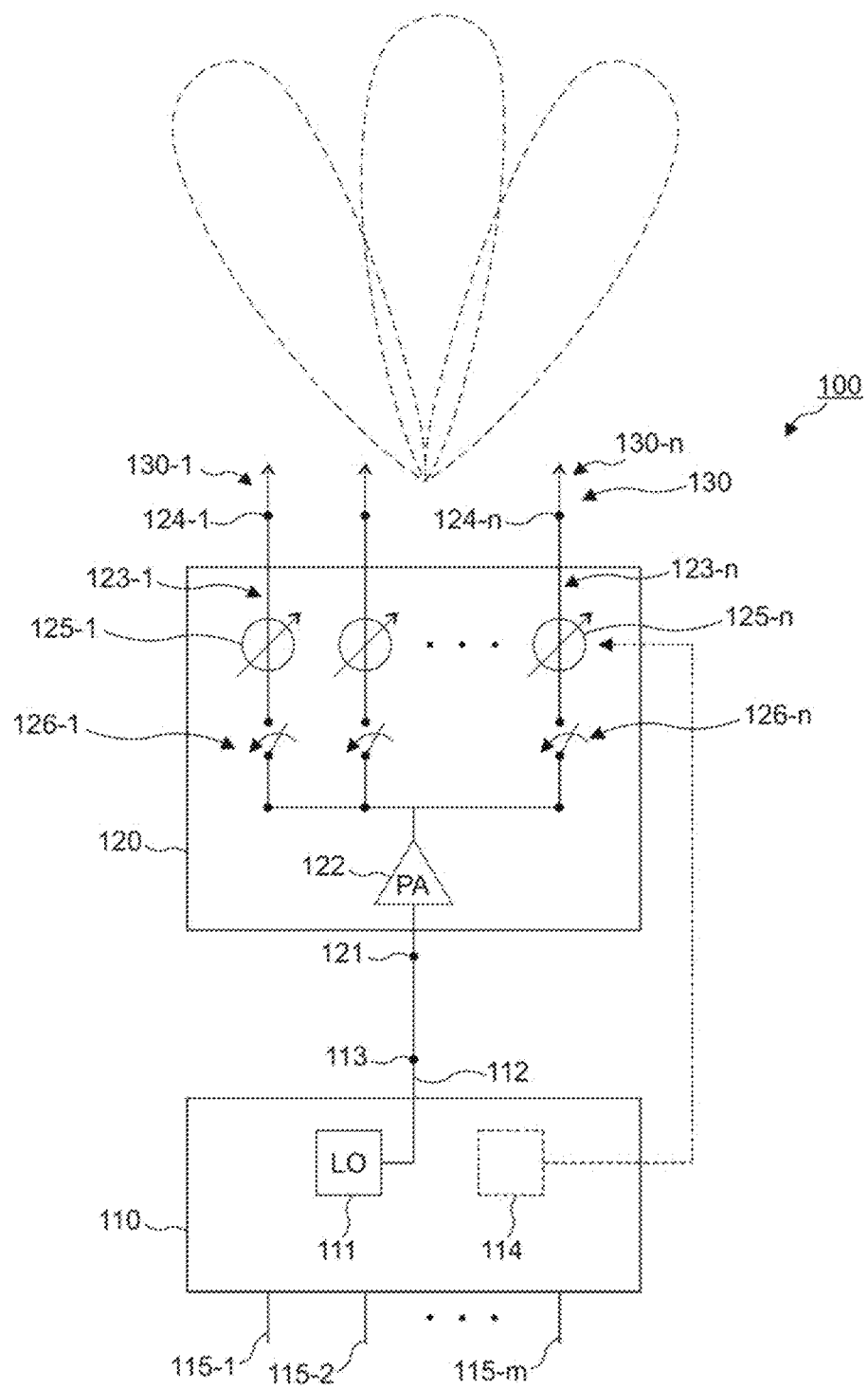
FIG. 1 shows a block diagram of a radar transmitting device with a phase-controlled and/or (de-)activatable antenna array in accordance with one example implementation of the present disclosure.

FIG. 1 shows a block diagram of a radar transmitting device 100 in accordance with one example implementation of the present disclosure.

The radar transmitting device 100 comprises a CMOS transceiver chip 110 and at least one BiCMOS transmitter chip 120 coupled to the CMOS transceiver chip 110. A transmitting antenna array 130 having antenna elements 130-1 to 130-$n$ ($n=2, 3, 4, \ldots$) can be connected to the BiCMOS transmitter chip 120 on the output side. The CMOS transceiver chip 110 and the at least one BiCMOS transmitter chip 120 can be arranged for example on a common printed circuit board and/or in a common package.

The CMOS transceiver chip 110 is configured, using a local oscillator circuit 111 implemented therein, to generate at least one local oscillator signal 112 and to provide the latter at an output 113 of the CMOS transceiver chip 110. The local oscillator signal 112 can be an RF radar signal, such as, for example, a pulsed radar signal, an unmodulated continuous-wave radar signal (CW signal), a modulated continuous-wave radar signal (FMCW signal), or alternatively an intermediate frequency signal as precursor of an RF radar signal. If appropriate, an intermediate frequency signal having a lower frequency than the finally emitted RF radar signal can simplify distribution of the signal between the chips 110, 120.

Besides transmission functionalities, the CMOS transceiver chip 110 also has reception functionalities. For this purpose, provision is made of one or more reception channels/inputs 115-1 to 115-$m$ ($m=2, 3, 4, \ldots$) for one or more reception signals, the one or more reception inputs being able to be coupled to receiving antennas. In contrast to the transmission end, however, no BiCMOS chips are arranged between the reception channels/inputs 115-1 to 115-$m$ and receiving antennas. The reception signals can be mixed with the local oscillator signal 112, for example, in the CMOS transceiver chip 110 in order then for example to obtain distance and/or speed information by way of a so-called range Doppler map.

The BiCMOS transmitter chip 120 has an input 121 for the local oscillator signal 112 provided by the CMOS transceiver chip 110. Furthermore, the BiCMOS transmitter chip 120 has at least one transmission amplifier 122 coupled to the input 121 and configured to amplify the local oscillator signal 112 or an RF radar signal based thereon for emission via the transmitting antenna array 130. For the case where the local oscillator signal 112 is distributed as an intermediate frequency signal to the BiCMOS transmitter chip 120, the BiCMOS transmitter chip 120 can have a frequency conversion circuit (not shown) in order to scale up the intermediate frequency signal in terms of frequency into the RF frequency range.

The BiCMOS transmitter chip 120 furthermore has a plurality of transmission paths 123-1 to 123-$n$ between the input 121 and a plurality of outputs 124-1 to 124-$n$. Some or each of the transmission paths 123-1 to 123-$n$ have/has a respective controllable analog phase shifter 125-1 to 125-$n$ for controllable beam scanning during emission of the respective RF radar transmission signal and/or for the setting of a MIMO code. In order to generate phase control signals for controlling the analog phase shifters 125-1 to 125-$n$, the CMOS transceiver chip 110 can have a phase control unit 114 that provides phase control signals. The CMOS transceiver chip 110 and the BiCMOS transmitter chip 120 can be coupled to one another via an SPI interface (SPI=Serial Peripheral interface), for example. It goes without saying that the phase control signals could also be generated in some other way—e.g. using a further controller chip.

Additionally or alternatively, each of the transmission paths 123-1 to 123-$n$ can have a respective controllable switch 126-1 to 126-$n$ in order to selectively activate or deactivate individual transmission paths 123 of the BiCMOS transmitter chip 120 using switching signals. The switching signals can for example likewise be generated by the control unit 114 of the CMOS transceiver chip 110 and be transferred using an SPI interface.

Receiver functionalities for the reception of reflected radar signals are not provided in the BiCMOS transmitter chip 120 in accordance with some example implementations. The BiCMOS transmitter chip 120 is purely a transmitter chip, whereas the CMOS transceiver chip 110 has both transmission and reception functionalities.

Besides the variant shown in FIG. 1 with a common transmission amplifier 122 for all the transmission paths 123-1 to 123-$n$, in accordance with some example implementations, it is also possible for a plurality of transmission amplifiers to be provided in the BiCMOS transmitter chip 120. By way of example, each transmission path 123-1 to 123-$n$ can be assigned a respective transmission amplifier in order to amplify the respective signals to transmission power. The transmission amplifier(s) 122 is/are preferably embodied using bipolar technology, which offers high speed, high gain and low output resistance. The analog phase shifters 125-1 to 125-$n$ of the BiCMOS transmitter chip can also be embodied using bipolar technology. By way of example, the analog phase shifters 125-1 to 125-$n$ can be realized in each case by a controllable RC element (or a network of RC elements).

The CMOS transceiver chip 110 and at least one BiCMOS transmitter chip 120 make it possible to achieve a phase-controlled antenna array (phased array antenna) for realizing an adaptive/cognitive radar sensor that can be used as a vehicle radar sensor, for example. A phased array antenna denotes a phase-controlled group antenna having a directional effect that achieves a concentration of the radiation energy using the arrangement and interconnection of individual radiators. If the individual radiators can be driven differently in terms of phase, the antenna pattern of the antenna is electronically scannable (electronic beam scanning).

The CMOS transceiver chip 110 is distinguished by a good PLL power (PLL=Phase Locked Loop) and digital integration abilities, for example. The BiCMOS transmitter chip 120 with a switchable phase at each transmission path has a good analog mmW power (mmW=Millimeter Wave) and a low current consumption. The multi-chip concept proposed additionally allows a fully scalable system approach.

Figure 2:
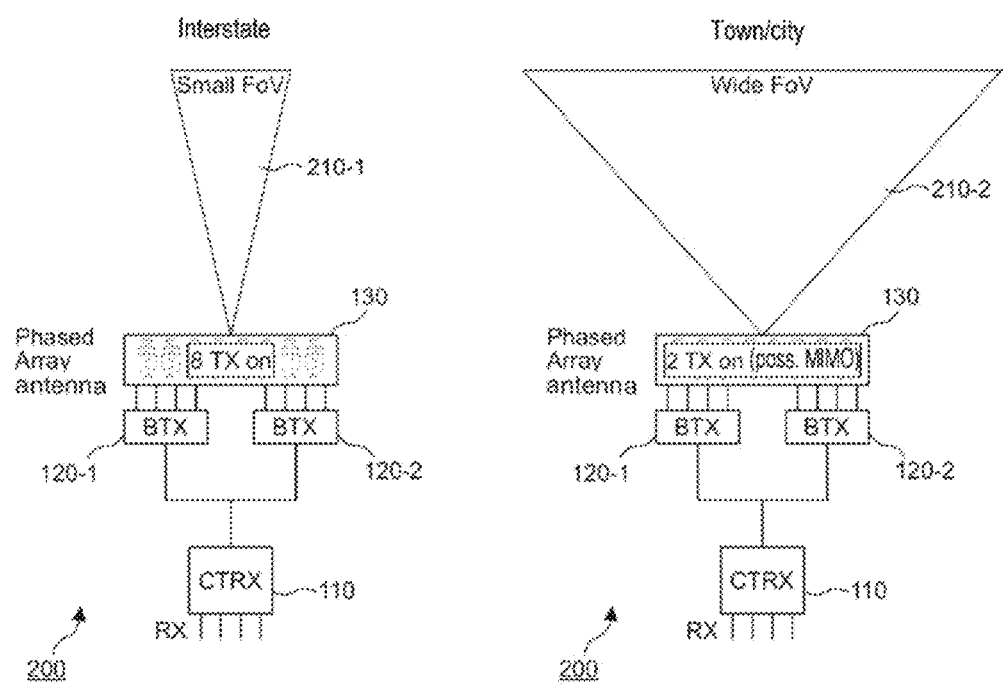
FIG. 2 shows two differently set transmission emission characteristics for different driving scenarios.

FIG. 2 shows by way of example two different settings of a radar transmitting device 200 according to the disclosure for different driving situations. In FIG. 2, the CMOS transceiver chip 110 is identified as "CTRX", and BiCMOS transmitter chips 120 are identified as "BTX".

The radar transmitting device 200 here has two BiCMOS transmitter chips 120-1 and 120-2 coupled to the CMOS transceiver chip 110. Each of the BiCMOS transmitter chips 120-1 and 120-2 has four transmission paths, for example. It goes without saying that other numbers of transmission paths are also possible. An antenna array 130 having eight antenna elements is connected to the resultant 2×4=8 transmission paths, such that each BiCMOS transmitter chip 120-1 and 120-2 operates a respective sub-array of 4 antenna elements.

In the scenario shown on the left in FIG. 2, in the BiCMOS transmitter chips 120-1 and 120-2, all 2×4=8 transmission paths are activated, such that a phased array antenna having a total of eight antenna elements is effective. In the scenario shown on the right, only one transmission path in each case is activated per BiCMOS transmitter chip 120-1 and 120-2, such that a phased array antenna having only two antenna elements is effective. In the scenario on the left, it is possible to achieve a comparatively high concentration of the radiation energy and thus a comparatively narrow antenna pattern 210-1. This can be expedient for monitoring the environment during interstate journeys, for example. In the scenario on the right, it is possible to achieve only a comparatively weak concentration of the radiation energy and thus a comparatively wide antenna pattern 210-2. This can be expedient for monitoring the environment during town/city journeys, for example, where what matters is the widest possible "field of view".

Figure 3:
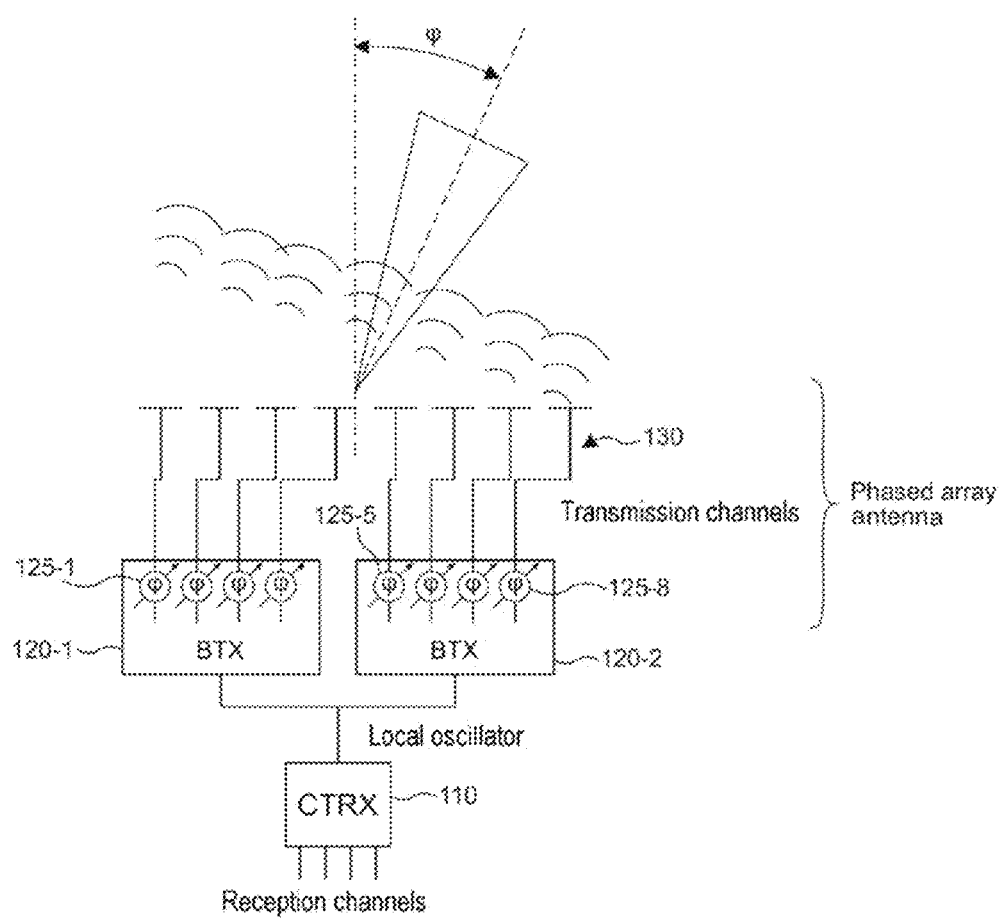
FIG. 3 shows an illustration of a radar transmitting device with two BiCMOS transmitter chips for beam scanning in accordance with one example implementation of the present disclosure.

Depending on the requirement, the CMOS transceiver chip 110 can selectively activate or deactivate individual transmission paths 123-1 to 123-$n$ of the BiCMOS transmitter chips 120-1 and 120-2 using corresponding control signals. Additionally or alternatively, the CMOS transceiver chip 110 can pivot the antenna patterns of the phased array antennas using corresponding phase control signals for controlling the analog phase shifters 125-1 to 125-$n$. This is illustrated in FIG. 3, which illustrates an antenna pattern pivoted by the angle $\theta$. This can be achieved using correspondingly set analog phase shifters 125-1 to 125-$n$. The control signals for this purpose can be provided by the CMOS transceiver chip 110.

In accordance with some example implementations, the phase-controlled antenna array can also be combined with reception-end digital beamforming. The CMOS transceiver chip 110 can thus also additionally be configured for digital beamforming for combination with the electronic beam scanning by the BiCMOS transmitter chip 120. Digital beamforming can be used at the reception end, for example, in order to adapt an antenna characteristic of a receiving antenna array (not shown) to the transmitter-end antenna pattern. The phases of the reception channels 115-1 to 115-$m$ can be set (digitally) during digital beamforming in such a way that an antenna characteristic or main reception direction is based on information of a transmitter-end antenna pattern. By way of example, transmission- and reception-end main reception directions can be set identically.

Additionally or alternatively, the CMOS transceiver chip 110 can also be configured for phase encoding of different radar transmission signals assigned to different transmission paths 123-1 to 123-$n$. Individual transmission or antenna paths 123-1 to 123-$n$ can thus be assigned a specific phase in accordance with a MIMO code. For example, in FIG. 2 (on the right), a phase of $\pi/2$ could be set in a first active transmission or antenna path, whereas a phase of $3\pi/2$ or $-\pi/2$ is set for the second active transmission or antenna path. That then corresponds for example to a phase modulation in accordance with a MIMO code with a value of e.g. "1" at the first transmission or antenna path and "0" at the second transmission or antenna path.

Regarding the direction of the phased array beam scanning, various implementations for azimuth and elevation are conceivable.

Figure 4:
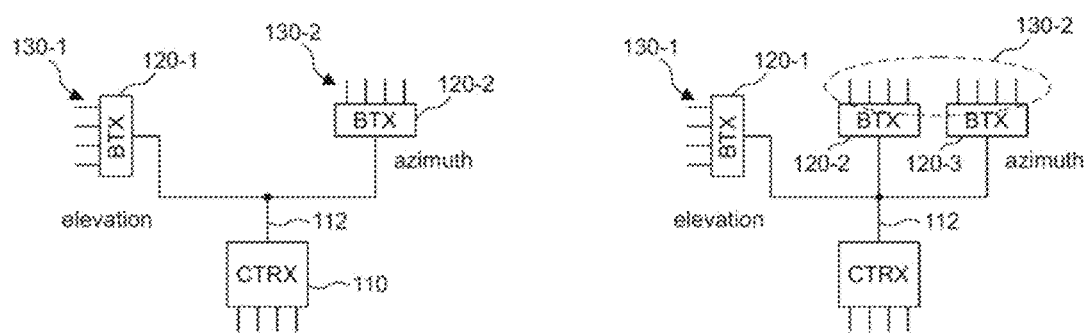
FIG. 4 shows an illustration of a radar transmitting device for beam scanning in azimuth and elevation directions.

The set-up in FIG. 4 (on the left) shows an implementation in which the first BiCMOS transmitter chip 120-1 is coupled to a vertical antenna array 130 (here having four antenna elements, for example) for beam scanning in an elevation direction and the second BiCMOS transmitter chip 120-2 is coupled to a horizontal antenna array 130-2 (here having four antenna elements, for example) for beam scanning in an azimuth direction. The CMOS transceiver chip 110 acts as a controller for both BiCMOS transmitter chips 120-1 and 120-2 and, besides the common local oscillator signal 112, also provides different phase control signals for the respective phase shifters 125 of the BiCMOS transmitter chips 120. By way of example, a measurement in an elevation direction could be activated only if an obstacle were ascertained using the horizontal antenna array 130-2, so as then also to obtain information about a vertical extent of the optical.

The set-up in FIG. 4 (on the right) shows a further possible implementation in which the first BiCMOS transmitter chip 120-1 is coupled to a vertical antenna array 130 (here having four antenna elements, for example) for beam scanning in an elevation direction. A second and a third BiCMOS transmitter chip 120-2, 120-3 are coupled to a horizontal antenna array 130-2 (here having eight antenna elements, for example) for beam scanning in an azimuth direction. In this case, the BiCMOS transmitter chips 120-2, 120-3 serve in each case for controlling a sub-array (here having four antenna elements, for example) of the horizontal antenna array 130-2—in a similar manner to the example implementations described with reference to FIG. 2. A resolution in an azimuth direction can thus be increased by comparison with the example implementation illustrated on the left.

Figure 5A:
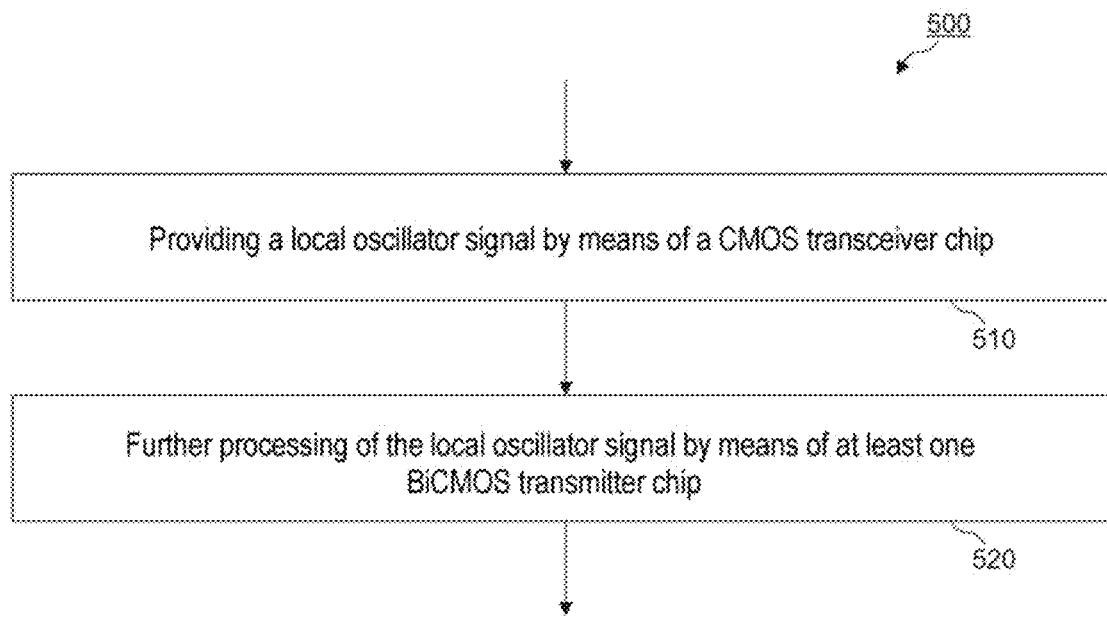
FIGS. 5A and 5B show methods for transmitting a radar signal in accordance with example implementations of the present disclosure.
Figure 5B:
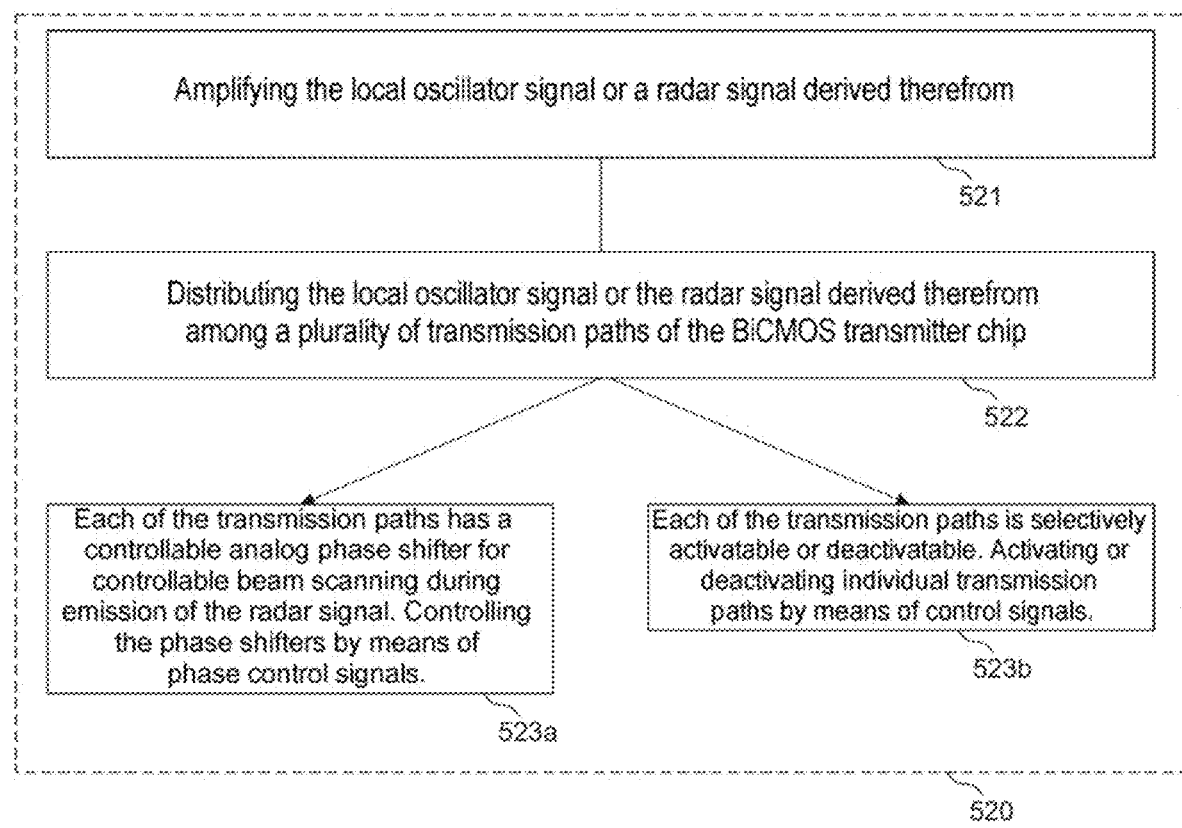

FIGS. 5A and 5B show in summary various example implementations of methods 500 that can be carried out by radar transmitting devices in accordance with the present disclosure.

As shown in FIG. 5A, all example implementations of the method 500 comprise providing 510 a local oscillator signal 112 using a CMOS transceiver chip 110. The example implementations furthermore all comprise further processing 520 of the local oscillator signal 112 using at least one BiCMOS transmitter chip 120. While the local oscillator signal 112 is thus generated by the CMOS transceiver chip 110 using a PLL, for example, it is distributed to one or more BiCMOS transmitter chips 120 and processed further there.

The further processing 520 of the local oscillator signal 112 by the at least one BiCMOS transmitter chip 120 can then differ depending on the example embodiment. That is illustrated in FIG. 5B, which illustrates two variants of the further processing 520.

Both variants of the further processing 520 comprise amplifying 521 the local oscillator signal 112 or a radar signal derived therefrom, and distributing 522 the local oscillator signal 112 or the radar signal derived therefrom among a plurality of transmission paths 123 of the BiCMOS transmitter chip 120.

In a first variant (on the right) of the further processing 520, each of the transmission paths has a controllable analog phase shifter 125 for controllable beam scanning during emission of the radar signal. Here the further processing 520 comprises controlling 523a the analog phase shifters using phase control signals that come from the CMOS transceiver chip 110, for example.

In a second variant (on the left) of the further processing 520, each of the transmission paths is selectively activatable or deactivatable. Here the further processing 520 comprises activating or deactivating 523b individual transmission paths using control signals that come from the CMOS transceiver chip 110, for example.

As has already been described further above, the various method variants are not mutually exclusive, but rather can also be combined with one another.

Aspects and features that have been described together with one or more of the examples and figures described in detail above can also be combined with one or more of the other examples in order to replace an identical feature of the other example or in order additionally to introduce the feature into the other example.

The description and drawings present only the principles of the disclosure. Furthermore, all examples mentioned here are intended to be used expressly only for illustrative purposes, in principle, in order to assist the reader in understanding the principles of the disclosure and the concepts contributed by the inventor(s) for further development of the art. All statements herein regarding principles, aspects and examples of the disclosure and also concrete examples thereof encompass the counterparts thereof.

A function block designated as "means for . . . " implementing a specific function can refer to a circuit configured for implementing a specific function. Consequently, a "means for something" can be implemented as a "means configured for or suitable for something" e.g. a component or a circuit configured for or suitable for the respective task.

It goes without saying that the disclosure of a plurality of steps, processes, operations or functions disclosed in the description or in the claims should not be interpreted as being in the specific order, unless this is explicitly or implicitly indicated otherwise, for example for technical reasons. The disclosure of a plurality of steps or functions therefore does not limit them to a specific order unless the steps or functions are not interchangeable for technical reasons. Furthermore, in some examples, an individual step, function, process or operation can include a plurality of partial steps, functions, processes or operations and/or be subdivided into them. Such partial steps can be included and be part of the disclosure of the individual step, provided that they are not explicitly excluded.

Furthermore, the claims that follow are hereby incorporated in the detailed description, where each claim can be representative of a separate example by itself. While each claim can be representative of a separate example by itself, it should be taken into consideration that—although a dependent claim can refer in the claims to a specific combination with one or more other claims—other examples can also encompass a combination of the dependent claim with the subject matter of any other dependent or independent claim. Such combinations are explicitly proposed here, provided that no indication is given that a specific combination is not intended. Furthermore, features of a claim are also intended to be included for any other independent claim, even if this claim is not made directly dependent on the independent claim.

The invention claimed is:

1. A radar transmitting device, comprising:
a Complementary Metal-Oxide Semiconductor (CMOS) transceiver chip configured to provide at least one local oscillator signal at an output of the CMOS transceiver chip,
wherein the CMOS transceiver chip includes transmission functionality and reception functionality; and a Bipolar Complementary Metal-Oxide Semiconductor (BiCMOS) transmitter chip coupled to the CMOS transceiver chip,
  wherein the BiCMOS transmitter chip does not include functionalities to receive one or more reflected radar signals,
  wherein the CMOS transceiver chip is configured to generate a local oscillator signal, of the at least one local oscillator signal, for the BiCMOS transmitter chip, and
  wherein the BiCMOS transmitter chip includes:
    an input for the local oscillator signal,
    at least one amplifier coupled to the input,
    a plurality of outputs for outputting a radar transmission signal based on the local oscillator signal, and
    a plurality of transmission paths between the input and the plurality of outputs,
      wherein each of the transmission paths has a controllable analog phase shifter for controllable beam scanning during emission of the radar transmission signal.

2. The radar transmitting device as claimed in claim 1, wherein the CMOS transceiver chip includes a phase control unit configured to generate phase control signals for controlling the controllable analog phase shifter for controllable beam scanning.

3. The radar transmitting device as claimed in claim 1, wherein the CMOS transceiver chip is configured to selectively activate or deactivate individual transmission paths of the BiCMOS transmitter chip using control signals.

4. The radar transmitting device as claimed in claim 1, wherein the CMOS transceiver chip is configured for digital beamforming for combination with the beam scanning by the BiCMOS transmitter chip.

5. The radar transmitting device as claimed in claim 4, wherein the CMOS transceiver chip has a plurality of reception channels, wherein phases of the plurality of reception channels are set during digital beamforming in such a way that a main reception direction is based on information of a set beam during beam scanning.

6. The radar transmitting device as claimed in claim 1, wherein the CMOS transceiver chip is configured for phase encoding of different radar transmission signals assigned to different transmission paths.

7. The radar transmitting device as claimed in claim 1, wherein the CMOS transceiver chip is configured to provide, at an output of the CMOS transceiver chip, at least one FMCW radar signal for the BiCMOS transmitter chip.

8. The radar transmitting device as claimed in claim 1, wherein the BiCMOS transmitter chip includes a first BiCMOS transmitter chip coupled to the CMOS transceiver chip and a second BiCMOS transmitter chip coupled to the CMOS transceiver chip.

9. The radar transmitting device as claimed in claim 8, wherein the first BiCMOS transmitter chip is coupled to a first antenna array for beam scanning in an elevation direction and the second BiCMOS transmitter chip is coupled to a second antenna array for beam scanning in an azimuth direction.

10. The radar transmitting device as claimed in claim 8, wherein the first BiCMOS transmitter chip is coupled to a first antenna array for beam scanning in an azimuth direction and the second BiCMOS transmitter chip is coupled to a second antenna array for beam scanning in an azimuth direction, or wherein the first BiCMOS transmitter chip is coupled to a first antenna array for beam scanning in an elevation direction and the second BiCMOS transmitter chip is coupled to a second antenna array for beam scanning in an elevation direction.

11. The radar transmitting device as claimed in claim 1, wherein the CMOS transceiver chip has one or more inputs for one or more reception signals, the one or more inputs being able to be coupled to receiving antennas.

12. The radar transmitting device as claimed in claim 1, wherein the amplifier of the BiCMOS transmitter chip is embodied using bipolar technology.

13. The radar transmitting device as claimed in claim 1, wherein the controllable analog phase shifter of the BiCMOS transmitter chip are embodied using bipolar technology.

14. The radar transmitting device of claim 1, wherein the transmission functionality of the CMOS transceiver chip does not provide one or more transmission signals to one or more transmission antennas.

15. A motor vehicle, comprising:
  a radar transmitting device comprising:
    a Complementary Metal-Oxide Semiconductor (CMOS) transceiver chip configured to provide at least one local oscillator signal at an output of the CMOS transceiver chip,
      wherein the CMOS transceiver chip includes transmission functionality and reception functionality; and
    a Bipolar Complementary Metal-Oxide Semiconductor (BiCMOS) transmitter chip coupled to the CMOS transceiver chip,
      wherein the BiCMOS transmitter chip does not include functionalities to receive one or more reflected radar signals,
      wherein the CMOS transceiver chip is configured to generate a local oscillator signal, of the at least one local oscillator signal, for the BiCMOS transmitter chip, and
      wherein the BiCMOS transmitter chip includes:
        an input for the local oscillator signal,
        at least one amplifier coupled to the input,
        a plurality of outputs for outputting a radar transmission signal based on the local oscillator signal, and
        a plurality of transmission paths between the input and the plurality of outputs,
          wherein each of the transmission paths has a controllable analog phase shifter for controllable beam scanning during emission of the radar transmission signal.

16. A method for transmitting a radar signal, comprising:
  providing a local oscillator signal using a Complementary Metal-Oxide Semiconductor (CMOS) transceiver chip,
    wherein the CMOS transceiver chip includes transmission functionality and reception functionality; and
  further processing of the local oscillator signal using a Bipolar Complementary Metal-Oxide Semiconductor (BiCMOS) transmitter chip,
    wherein the BiCMOS transmitter chip does not include functionalities to receive one or more reflected radar signals, and
    wherein the further processing on the BiCMOS transmitter chip includes:
      amplifying the local oscillator signal or a radar signal derived therefrom, distributing the local oscillator signal or the radar signal derived therefrom among a plurality of transmission paths of the BiCMOS transmitter chip,
    wherein each of the transmission paths has a controllable analog phase shifter for controllable beam scanning during emission of the radar signal, and
    controlling the controllable analog phase shifter using control signals.

17. A radar transmitting device, comprising:
a Complementary Metal-Oxide Semiconductor (CMOS) transceiver chip configured to provide at least one local oscillator signal at an output of the CMOS transceiver chip,
    wherein the CMOS transceiver chip includes transmission functionality and reception functionality; and
a Bipolar Complementary Metal-Oxide Semiconductor (BiCMOS) transmitter chip coupled to the CMOS transceiver chip,
    wherein the BiCMOS transmitter chip does not include functionalities to receive one or more reflected radar signals,
    wherein the CMOS transceiver chip is configured to generate a local oscillator signal, of the at least one local oscillator signal, for the BiCMOS transmitter chip, and
    wherein the BiCMOS transmitter chip includes:
        an input for the local oscillator signal,
        at least one amplifier coupled to the input,
        a plurality of outputs for outputting a radar transmission signal based on the local oscillator signal, and
        a plurality of transmission paths between the input and the plurality of outputs, and
    wherein the CMOS transceiver chip is configured to selectively activate or deactivate individual transmission paths of the BiCMOS transmitter chip using control signals.

18. The radar transmitting device as claimed in claim 17, wherein the CMOS transceiver chip is configured for phase encoding of different radar transmission signals assigned to different transmission paths.

19. The radar transmitting device as claimed in claim 17, wherein each of the transmission paths has a controllable analog phase shifter for controllable beam scanning during emission of the radar transmission signal.

20. A method for transmitting a radar signal, comprising:
providing a local oscillator signal using a Complementary Metal-Oxide Semiconductor (CMOS) transceiver chip,
    wherein the CMOS transceiver chip includes transmission functionality and reception functionality;
further processing of the local oscillator signal using a Bipolar Complementary Metal-Oxide Semiconductor (BiCMOS) transmitter chip,
    wherein the BiCMOS transmitter chip does not include functionalities to receive one or more reflected radar signals,
    wherein the further processing on the BiCMOS transmitter chip comprises:
        amplifying the local oscillator signal or a radar signal derived therefrom;
        distributing the local oscillator signal or the radar signal derived therefrom among a plurality of transmission paths of the BiCMOS transmitter chip,
            wherein each of the transmission paths is selectively activatable or deactivatable; and
    activating or deactivating individual transmission paths using control signals.

\* \* \* \* \*